United States Patent [19]

Rasmussen

[11] Patent Number: 4,844,645
[45] Date of Patent: Jul. 4, 1989

[54] LOCKING SYSTEM
[75] Inventor: Steve O. Rasmussen, Vancouver, Wash.
[73] Assignee: Hewlett-Packard Company, Palo Alto, Calif.
[21] Appl. No.: 161,560
[22] Filed: Feb. 29, 1988
[51] Int. Cl.[4] ............................................. F16B 2/22
[52] U.S. Cl. ........................................ 403/14; 24/625; 24/664; 403/316; 403/254
[58] Field of Search ................ 24/625, 662, 664, 665, 24/697, 615, 614, 616; 403/316, 319, 252, 254

[56] References Cited
U.S. PATENT DOCUMENTS
4,408,373 10/1983 Miskowicz ........................ 24/664
4,425,689 1/1984 Fildan ............................... 24/664
4,552,540 11/1985 Bass ................................. 441/106

Primary Examiner—Andrew V. Kundrat
Assistant Examiner—Carol I. Bordas
Attorney, Agent, or Firm—S. A. Kassatly

[57] ABSTRACT

A locking system is described for detachably securing two workpieces together (e.g., two housing sections). Elongated arms are carried by one workpiece and a corresponding opening(s) is present in the other workpiece. The outer end of each elongated arm is resiliently deflectable so that it is deflected when being inserted into the opening in the one workpiece; then the arm springs back. A locking arm on the second workpiece is then able to move behind the end of the elongated arm to restrict deflection of the arm, thus preventing any unintentional unlocking of the two workpieces.

20 Claims, 3 Drawing Sheets

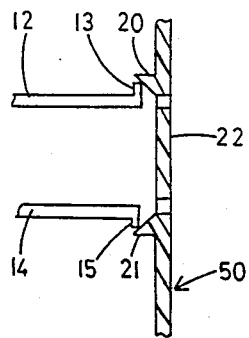
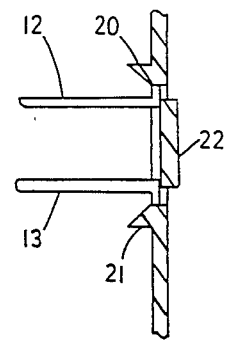
FIG. 2
FIG. 3
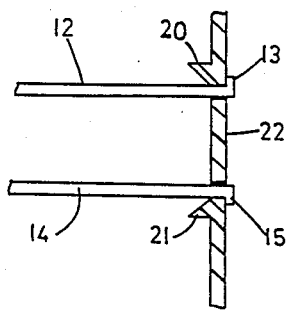
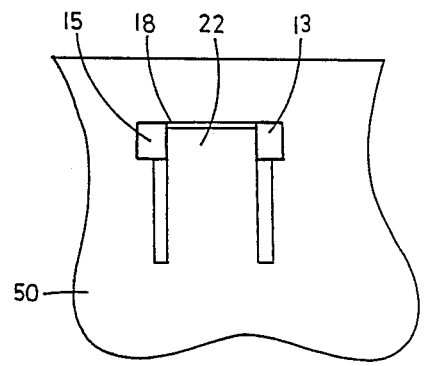
FIG. 4
FIG. 5

LOCKING SYSTEM

FIELD OF THE INVENTION

This invention relates to systems and techniques for detachably securing two items together. More particularly, this invention relates to systems and techniques for detachably securing two workpieces together (e.g., two sections of a housing).

BACKGROUND OF THE INVENTION

There are many situations where it is necessary or desirable to detachably secure two items or workpieces together. For example, housing sections used to enclose or contain a product must be fastened in some manner so as to be secure when the product is used, but preferably the housing sections are detachable so that they can be removed to allow access to the product (e.g., for repair purposes).

Various types of products require the type of enclosure or containment described. Such products include, for example, gears, electronics, linkages, tubing or wiring which must be clamped or secured in place, and other various mechanisms. The workpieces may be housings for electrical components, mounting or clamping devices, or locating components of a mechanical gear train or linkage.

Various types of fastening devices can be used to detachably secure items such as housing sections to each other or to a product to be enclosed. For example, various types of threaded fasteners or other mechanical fasteners have been used for this purpose. However, this requires that additional components be used, thereby increasing the cost of the enclosure.

The use of a conventional cantilever beam with a hook on its outer end is also known as a means for securing two workpieces together. In such case, the outer end of the cantilever beam is inserted into an opening in the second workpiece. However, when a tensile load is exerted on the arm it can pull free of the second workpiece relatively easily. This is because the force exerted on the hook portion of a cantilever beam is not centrally applied to the beam. As a result, when a tensile load is exerted on the arm a moment is created which forces the beam to deflect. As the beam deflects, the angle of the hook portion changes such that a component of the force pushes the end of the beam back even further. Eventually the hook portion slips free and the workpieces become detached.

Other conventional types of fastening systems include hook and loop fasteners (such as VELCRO brand fasteners), over-center latches, and press fit fasteners (e.g., where a post is pushed into an opening with great force to frictionally engage the walls of the opening). Each of these systems has limitations, however. Hook and loop fasteners have structural limitations. Latches can be complex and also costly. Press fit fasteners may lose their effectiveness after being detached one or more times.

There has not heretofore been provided a locking system of the type described herein for detachably securing two workpieces together.

SUMMARY OF THE PRESENT INVENTION

In accordance with the present invention there is provided a locking system for detachably securing two workpieces such as housing sections together. In one embodiment the locking system comprises:

(a) one or more elongated arms having first and second ends, wherein the first end of each such arm is secured to the first workpiece, wherein the elongated arm projects outwardly from the first workpiece; wherein the second end is resiliently deflectable; and wherein the second end includes a hook portion or other engagement means;

(b) an opening in the second workpiece;

(c) lead in ramp means adapted to guide the second end of the elongated arm into the opening in the second workpiece;

(d) a locking arm carried by the second workpiece, the locking arm being movable between an open position and a closed position.

The second end of the elongated arm can be deflected by the lead in ramp means when the first workpiece is urged toward the second workpiece. This enables the second end of the elongated arm to pass through the opening. The locking arm is movable to its closed position behind the second end of the elongated arm to restrict movement of the second end. The hook portion or engagement means on the end of the elongated arm engages the second workpiece. The locking arm prevents the hook portion of the elongated arm from backing out of the opening in the second workpiece when the elongated arm is loaded in tension, thereby preventing the previously-described failure.

Unlocking requires that the locking arm be moved from its closed to its open position. Then the second end of the elongated arm can be deflected so that the hook portion or engagement means is released from the second workpiece, allowing the elongated arm to be moved out of the opening in the second workpiece.

Preferably there are a plurality of such elongated arms carried by the first workpiece and a corresponding plurality of openings in the second workpieces. If desired, there may also be one or more of such elongated arms on the second workpiece, and one or more corresponding openings in the first workpiece.

In another embodiment there are a plurality of pairs of elongated arms carried by the first workpiece. After the free ends of the arms are passed through an opening in the second workpiece, the locking arm moves to its closed position between the parallel arms to restrict movement of the arms towards each other.

Other advantages of the locking systems of this invention will be apparent from the following detailed description and the accompanying drawings.

BRIEF DESCRIPTION OF THE DRAWINGS

The invention is described in more detail hereinafter with reference to the accompanying drawings, wherein like reference characters refer to the same parts throughout the several views and in which:

FIGS. 2, 3 and 4 are top views (partially cut-away) of the locking system illustrating the manner in which the elongated arms are guided into an opening in the second workpiece and locked in position;

FIG. 5 is a side elevational view showing the arms secured to the second workpiece;

DETAILED DESCRIPTION OF THE INVENTION

Figure 1:
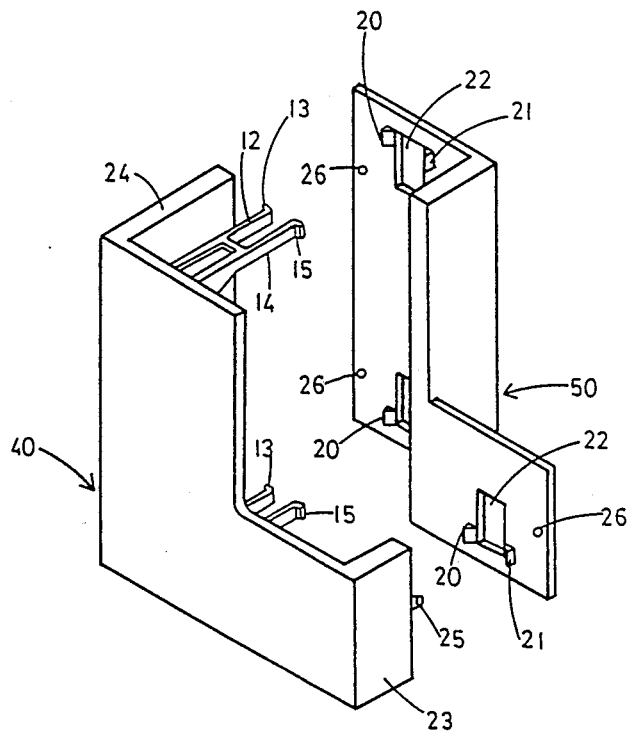
FIG. 1 is a perspective view of two housing sections which are adapted to be detachably secured together using the locking system of the invention.

In FIGS. 1-5 there is illustrated one embodiment of locking system of the invention. As illustrated in the drawings, the two workpieces may be housing sections which are used to enclose a product (e.g., a gear train, electronics system, etc.)

The locking system illustrated includes pairs of elongated, parallel arms 12 and 14. At one end the parallel arms are secured to one of the workpieces 40. Preferably, the arms are integrally molded as a part of the workpiece 40. Alternatively, the arms could be attached to the workpiece with adhesive or other fasteners.

The second workpiece 50 includes a plurality of openings 18 corresponding to the number of pairs of parallel arms carried by the first workpiece 40. On the interior surface of the second workpiece there are shown lead in ramp members 20 and 21 adjacent opposite side edges of each opening 18. Extending into the opening 18 is a locking arm 22 which is movable between an open position and a closed position. Preferably the locking arm is integral with the work piece at one end in a manner such that the opposite end of the locking arm is deflectable out of the opening but will return to its normal position within the opening.

The outer ends of the elongated arms 12 and 14 include hook portions 13 and 15, respectively. The outer ends of the arms are resiliently deflectable so that they may be urged towards each other to fit within the corresponding opening in the second workpiece. Then the arms spring away from each other again in a manner such that the hook portions 13 and 15 engage the second workpiece. The locking arm can then deflect back to its closed position where it is situated between the ends of the elongated arms to restrict movement of the ends towards each other These features are illustrated in FIGS. 2-5. In FIG. 2 the outer ends of the elongated arms 12 and 14 are shown contacting the lead in ramp members 20 and 21, respectively, which are located adjacent opposite side edges of opening 18. The lead in ramp members serve as guide members to urge the outer ends of the elongated arms towards each other when the first workpiece 40 is moved toward the second workpiece 50.

In FIG. 3 the outer ends of the arms 12 and 14 have been urged towards each other so that they can be passed into opening 18 in the second workpiece. At the same time the outer ends urge or deflect the free end of locking arm 22 outwardly away from the opening.

In FIG. 4 the outer ends of arms 12 and 14 have passed completely through the opening 18 and have sprung outwardly so that the hook portions have engaged the second workpiece. The free end of the locking arm has deflected back to its normal closed position within opening 18. In this position the locking arm is positioned between the outer ends of the elongated arms to prevent them from moving towards each other.

Thus, the locking 22 arm prevents the elongated arms from coming loose from the second workpiece when tension is applied to the elongated arms. Yet the two workpieces can be easily separated from each other when desired by first moving each locking arm 22 away from the ends of the arms 12 and 14 to allow them to be moved towards each other. In this manner the hook portions are disengaged from the second workpiece.

As shown in FIG. 1, side walls 23 and 24 of workpiece 40 serve to establish the desired minimum spacing between the two workpieces. Thus, when the sidewalls contact the other workpiece the desired spacing is maintained.

Figure 7:
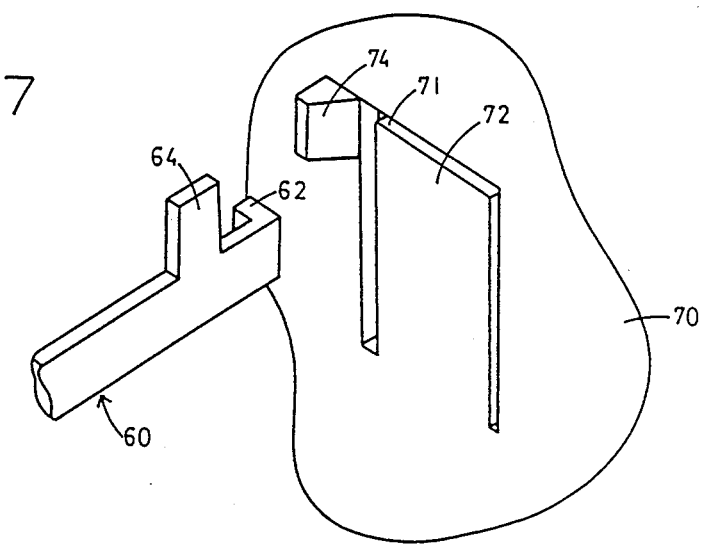
FIG. 7 is a perspective view illustrating another embodiment of locking system of this invention

Another manner of establishing the desired spacing between the two workpieces is illustrated in FIG. 7. In this figure there is shown the free end of an elongated arm 60 which is supported by one workpiece (not shown). The other workpiece 70 includes an opening 71 in which a locking arm 72 is disposed. Ramp member 74 is carried by workpiece 70 adjacent one edge of opening 71.

When elongated arm 60 is moved towards workpiece 70, ramp member 74 guides the end of arm 60 into opening 71 where it deflects the upper end of locking arm 72 out of opening 71. Then when the end of arm 60 is through opening 71, locking arm 72 springs back behind arm 60 so that hook member 62 remains in engagement with workpiece 70. Ledge or stop member 64 on arm 60 serves to limit the extent to which arm 60 may pass through opening 71. In this manner the minimum spacing between the two workpieces is maintained.

Positional alignment between the two workpieces may be provided by referencing pins 25 on one workpiece and alignment apertures 26 on the other workpiece, as illustrated in FIG. 1. Such alignment is not required in all cases but it may be helpful in situations where a high degree of positional accuracy is required.

Figure 6:
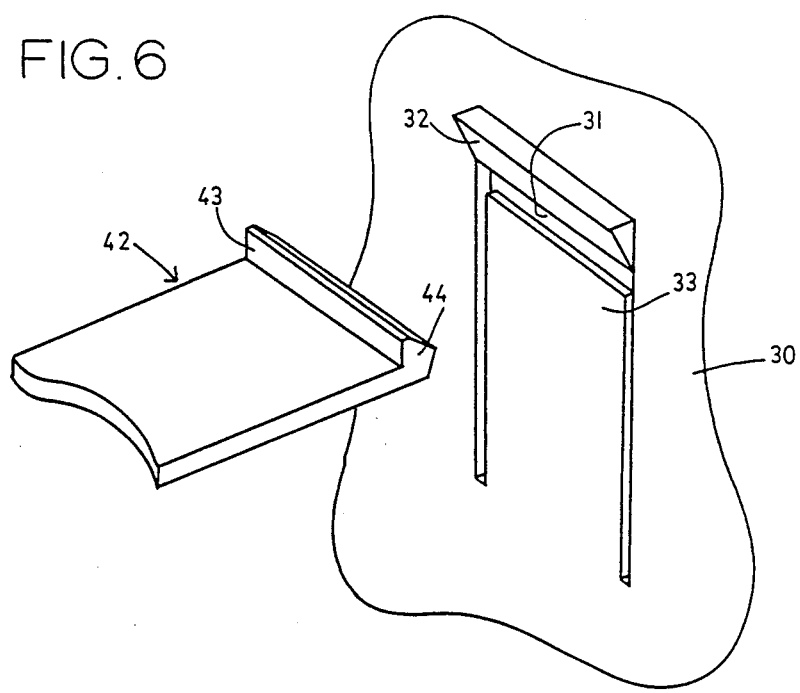
FIG. 6 is a perspective view of another embodiment of locking system of this invention.

FIG. 6 illustrates another embodiment of the locking system of this invention. One workpiece 30 includes opening 31. Locking arm 33 is disposed in opening 31, as illustrated. Ramp member 32 is carried by workpiece 30 adjacent the top edge of opening 31.

An elongated arm 42 carried by another workpiece (not shown) is adapted to pass through opening 31 in workpiece 30. The outer or free end of arm 42 includes an upstanding wall or hook member 43 which is adapted to engage the outer surface of workpiece 30 after it has been passed through opening 31. The leading end of arm 42 includes a ramp member 44 to assist in guiding this end of arm 42 into opening 31 when the two workpieces are brought together.

Locking arm 33 is deflected out of opening 31 by the end of arm 42. Then arm 33 springs back into its original position where it holds arm 42 against the upper edge of opening 31. This assures that hook portion 43 is maintained in engagement with workpiece 30.

In order to detach one workpiece from the other, the locking arm 33 is deflected out of the way. Then the arm 42 can be deflected downwardly so that the hook member 43 is disengaged from workpiece 30. At that point the arm 42 may be moved out of opening 31.

Other embodiments are also possible. For example, there may be three elongated arms which are adapted to be passed through a single opening in the other workpiece. In such embodiment two of the arms may be adapted to engage the second workpiece along side edges of the opening while the third arm is adapted to enage the second workpiece along the top edge of the opening.

Other changes and modifications will be readily apparent to those skilled in the art, and all such changes and modifications are considered to fall within the scope of this invention, as defined in the appended claims.

What is claimed is:

1. A locking system for detachably securing first and second workpieces together, wherein said system comprises:
   (a) at least one elongated arm having first and second ends, wherein said first end is secured to said first workpiece, wherein said elongated arm projects outwardly from said first workpiece and is perpendicular thereto; wherein said second end is resiliently deflectable; and wherein said second end includes a hook portion;
   (b) an opening in said second workpiece;
   (c) a lead in ramp means adapted to guide said second end of said elongated arm into said opening;
   (d) a locking arm carried by said second workpiece, said locking arm being movable between an open position and a closed position;

wherein said second end of said elongated arm is adapted to be deflected by said lead in ramp means when said first workpiece is moved toward said second workpiece so as to enable said second end of said elongated arm to pass through said opening and move said locking arm to said open position, and wherein said locking arm is movable to said closed position to restrict deflection of said second end of said elongated arm; and wherein said hook portion of said elongated arm engages said second workpiece.

2. A locking system in accordance with claim 1, wherein said first workpiece includes a plurality of pairs of said elongated arms, and wherein said second workpiece includes a corresponding plurality of said openings and said locking arms.

3. A locking system in accordance with claim 1, wherein said first and second workpieces comprise mating sections of a housing.

4. A locking system in accordance with claim 1, wherein said locking arm includes first and second ends, wherein said first end is secured to said second workpiece, and wherein said second end is adapted to be deflected away from said opening when said second end of said elongated arm is inserted into said opening.

5. A locking system in accordance with claim 4, wherein said locking arm and said second workpiece comprise plastic, and wherein said locking arm is integral with said second workpiece.

6. A locking system for detachably securing first and second workpieces together, wherein said system comprises:
   (a) a plurality of elongated arms having first and second ends, wherein said first ends are secured to said first workpiece, wherein each said elongated arm projects outwardly from said first workpiece and is perpendicular thereto; wherein said second end is resiliently deflectable; and wherein said second end includes engagement means adapted to engage said second workpiece;
   (b) a plurality of openings in said second workpiece corresponding to the number of said elongated areas;
   (c) lead in ramp members adapted to guide said second ends of said elongated arms into said openings;
   (d) a plurality of locking arms corresponding to the number of said openings, each said locking arm being carried by said second workpiece and being movable between an open position and a closed position;

wherein said second end of each said elongated arm is adapted to be deflected by said ramp member when said first workpiece is moved toward said second workpiece so as to enable said second ends to pass through said opening and move said locking arm to said open position, and wherein each said locking arm is movable to said closed position to restrict deflection of said second end of said elongated arm and wherein said engagement means engages said second workpiece.

7. A locking system in accordance with claim 6, wherein said first and second workpieces comprise mating sections of a housing.

8. A locking system in accordance with claim 6, wherein said locking arm includes first and second ends, wherein said first end is secured to said second workpiece, and wherein said second end is adapted to be deflected away from said opening when said second end of a said elongated arm is inserted into said opening.

9. A locking system in accordance with claim 8, wherein said locking arm and said second workpiece comprise plastic, and wherein said locking arm is integral with said second workpiece.

10. A locking system in accordance with claim 6, wherein said engagement means comprises a hook member which is adapted to be passed through a corresponding opening in said second workpiece.

11. A locking system in accordance with claim 6, wherein said ramp members are carried by said second workpiece and are disposed adjacent an edge of a said opening.

12. A locking system in accordance with claim 11, wherein said ramp members are integral with said second workpiece.

13. A locking system in accordance with claim 6, wherein there are a plurality of pairs of said elongated arms, and wherein each said pair of elongated arms projects outwardly from said first workpiece in a manner such that said arms of each said pair are generally parallel.

14. A locking system in accordance with claim 13, wherein said ramp members are disposed adjacent opposite side edges of a said opening.

15. A locking system in accordance with claim 14, wherein said locking arm is movable to said closed position between said second ends of said elongated arms to restrict movement of said ends towards each other.

16. A locking system in accordance with claim 6, wherein said second end of each said elongated arm includes a said ramp member.

17. A locking system in accordance with claim 6, wherein said second end further includes a stop member which is adapted to rest against said second workpiece to restrict additional movement of said workpieces towards each other after said second end of each said elongated arm is passed through a said opening.

18. A locking system in accordance with claim 16, wherein said second workpiece includes a said ramp member adjacent an edge of said opening.

19. A locking system for detachably securing first and second workpieces together, wherein said system comprises:
   (a) a plurality of pairs of elongated arms each having first and second ends, wherein said first end is secured to said first workpiece, wherein each said elongated arm projects outwardly from said first workpiece; wherein said second end is resiliently deflectable; and wherein said second end includes a hook portion;

(b) a plurality of openings in said second workpiece corresponding to the number of said pairs;

(c) lead in ramp means adapted to guide said second end of a said elongated arm into a said opening;

(d) a plurality of locking arms carried by said second workpiece, each said locking arm being movable between an open position and said closed position;

wherein said second end of each said elongated arm is adapted to be deflected by said lead in ramp means when said first workpiece is moved toward said second workpiece so as to enable said second end of each said elongated arm to pass through a said opening and move a said locking arm to said open position, and wherein each said locking arm is movable to said closed position to restrict deflection of said second end of said elongated arm; and wherein said hook portion of each said elongated arm engages said second workpiece.

20. A locking system for detachably securing first and second workpieces together, wherein said system comprises:

(a) a plurality of pairs of elongated arms, wherein each said arm includes first and second ends, wherein said first ends are secured to said first workpiece, wherein each said elongated arm projects outwardly from said first workpiece; wherein said second end is resiliently deflectable;

wherein said second end includes engagement means adapted to engage said second workpiece; and wherein each said pair of elongated arms projects outwardly from said first workpiece in a manner such that said arms of each said pair are generally parallel;

(b) a plurality of openings in said second workpiece corresponding to the number of said pairs of elongated arms;

(c) lead in ramp members adapted to guide said second ends of said elongated arms into said openings;

(d) a plurality of locking arms corresponding to the number of said openings, each said locking arm being carried by said second workpiece and being movable between an open position and a closed position;

wherein said second end of each said elongated arm is adapted to be deflected by said ramp member when said first workpiece is moved toward said second workpiece so as to enable said second ends to pass through said opening and move said locking arm to said open position, and wherein each said locking arm is movable to said closed position to restrict deflection of said second end of said elongated arm and wherein said engagement means engages of second workpiece.

* * * * *